United States Patent [19]

Waible

[11] Patent Number: 6,154,077
[45] Date of Patent: Nov. 28, 2000

[54] BISTABLE FLIP-FLOP

[75] Inventor: Hans-Peter Waible, Flein, Germany

[73] Assignee: TEMIC Semiconductor GmbH, Heilbronn, Germany

[21] Appl. No.: 09/186,063

[22] Filed: Nov. 9, 1998

[30] Foreign Application Priority Data

Nov. 8, 1997 [DE] Germany ............................ 197 49 521

[51] Int. Cl.[7] .................................................. H03K 3/02
[52] U.S. Cl. .......................... 327/185; 327/199; 327/200; 327/211; 327/212
[58] Field of Search ................................... 327/199, 200, 327/211, 212, 185

[56] References Cited

U.S. PATENT DOCUMENTS 4,521,695  6/1985  Mazin ....................................... 307/279

FOREIGN PATENT DOCUMENTS

WO97/15116  4/1997  WIPO .

OTHER PUBLICATIONS

Patents Abstracts of Japan, Sect. E, vol. 18, No. 661 (E–1644) (Dec. 14, 1994).
Patents Abstracts of Japan, Sect. E, vol. 12, No. 342 (E–658) (Sep. 14, 1988).

Primary Examiner—Timothy P. Callahan
Assistant Examiner—Cassandra Cox
Attorney, Agent, or Firm—Venable; George H. Spencer; Norman N. Kunitz

[57] ABSTRACT

In a known bitable flip-flop, a first inverter stage (1) is driven by an input signal (D), a second inverter stage (2) by a clock signal (CLK), and a third inverter stage (3) by an output signal (INV2) of the second inverter stage (2). In order to buffer the output signal levels of the inverter stages, the first and third inverter stages (1, 3) can be switched into a disabling state by the clock signal (CLK) and the second inverter stage (2) by an output signal (INV1) of the first inverter stage (1). The new bistable flip-flop is to be set independently of the input signal. For setting the flip-flop, preferably of CMOS design, field-effect transistors (M10, M11) are provided in the third and second inverter stages (3, 2) which inhibit disabling of the third inverter stage (3) by a set signal (SET) and a signal (SETN) that is complementary to it and which allow disabling of the second inverter stage (2) independently of the output signal (INV1) of the first inverter stage (1). The invention is useable in counter modules/frequency dividers.

9 Claims, 2 Drawing Sheets

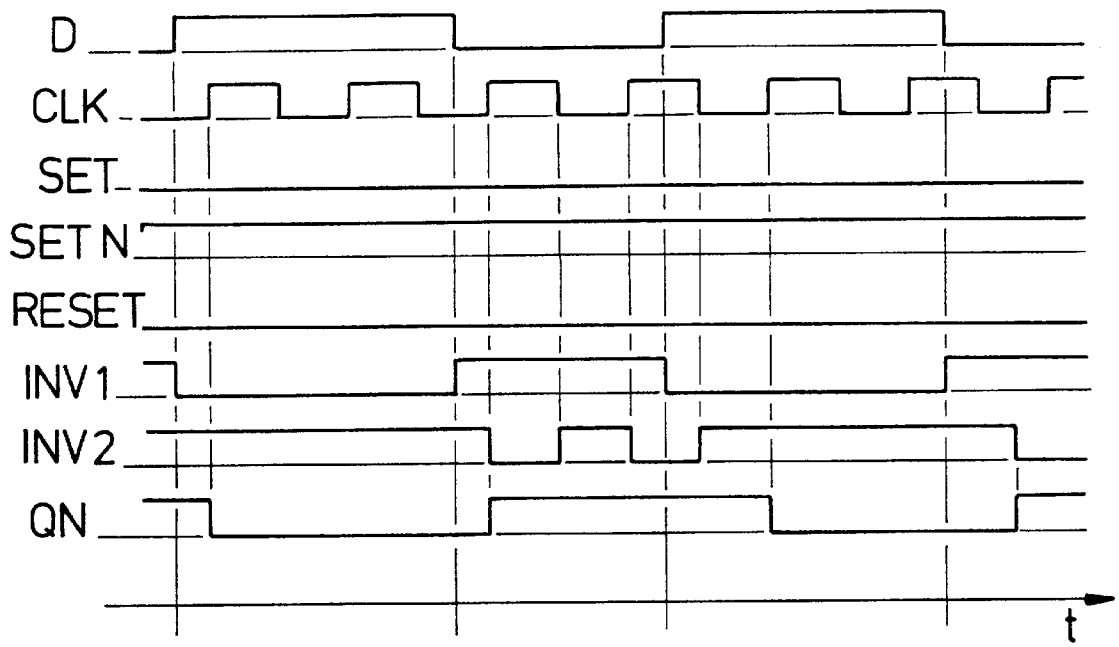
FIG. 2
FIG. 3
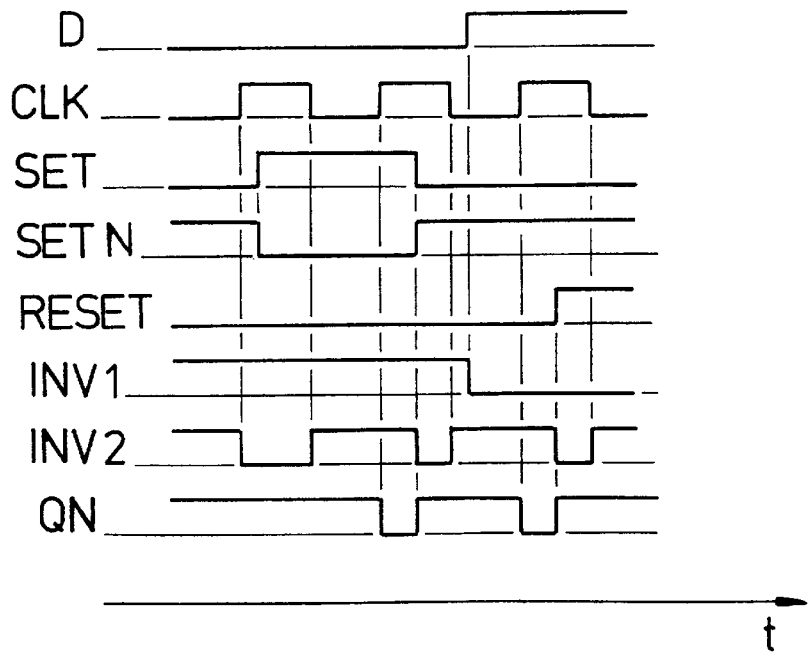

BISTABLE FLIP-FLOP

BACKGROUND OF THE INVENTION

The invention relates to a bistable flip-flop with a first inverter stage driven by an input signal and capable of being switched into a disabling state by a clock signal, with a second inverter stage which is driven by the clock signal and which can be switched into a disabling state by an output signal of the first inverter stage, and with a third inverter stage which is driven by an output signal of the second inverter stage and which can be switched into a disabling state by the clock signal.

A bistable flip-flop of this kind is known from the published proceedings of the "IEEE 1993—Custom Integrated Circuits Conference", pp. 27.6.1–27.6.4. The bistable flip-flop designated there as dynamic flip-flop has three inverter stages of which the first is triggered by an input signal, the second by a clock signal, and the third by an output signal from the second inverter stage. The first inverter stage can be switched here into a disabling state by a high level of the input signal, the second inverter stage by a low level of the output stage of the first inverter stage, and the third inverter stage by a low level of the clock signal. In this disabling state, the signal levels are temporarily stored at the outputs of the respective inverter stage. The result, an output signal corresponding to the inverted input signal and with signal edges synchronized to the clock signal, is obtained at the output of the third inverter stage.

The main disadvantage of this known flip-flop is that it cannot be put into a defined state independently of the input signal, i.e., the signal level at the output of the third inverter stage cannot be preset independently of the input signal.

SUMMARY OF THE INVENTION

The object of the invention is to provide a bistable flip-flop of the type discussed above that can be put into a defined state within one clock period.

The object is solved by a bistable flip-flop with a first inverter stage driven by an input signal (D) and capable of being switched into a disabling state by a clock signal (CLK), with a second inverter stage which is driven by the clock signal (CLK) and which can be switched into a disabling state by an output signal (INV1) of the first inverter stage, and with a third inverter stage which is driven by an output signal (INV2) of the second inverter stage and which can be switched into a disabling state by the clock signal (CLK), and wherein the third inverter stage can be switched into a non-disabling state by a first set signal (SET) and the second inverter stage can be switched into the disabled stage by a second set signal (SETN) at a specific signal level of the clock signal (CLK). Advantageous developments and further developments are described.

Accordingly, the essence of the invention is to provide a first setting signal to prevent the third inverter stage from switching to the disabling state, and to provide a second setting signal to switch the second inverter stage into the disabling state at a specific signal level of the clock signal, for instance at a high level, so that the signal level of the clock signal effective before the disabling of the second inverter stage defines the signal level of the output signal of the second inverter stage and immediately thereafter, due to the non-disabling third inverter stage, the signal level of the output signal of the third inverter stage, for instance at a low level. In this way, the flip-flop can be set within one period of the clock signal.

In a preferred further development, the second inverter stage can be switched into a non-disabling state by a reset signal. Because the output signal of the second inverter stage and the clock signal are then in phase opposition, the output signal of the third inverter stage then assumes within one period of the clock signal the signal level of the clock signal effective before the disabling of the third inverter stage.

Because of the linear structure and the small number of components required, the flip-flop in accordance with the invention can be made simply and at low cost. Furthermore, it has a low current consumption and operates at high speed so that it is ideally suited for use in high-frequency modules, for instance in the manufacture of high-speed frequency divider and counter modules of the type generally used in phase-locked loops.

BRIEF DESCRIPTION OF THE DRAWINGS

FIG. 2 shows pulse diagrams for the flip-flop shown in FIG. 1.

FIG. 3 shows further pulse diagrams for the flip-flop shown in FIG. 1.

DESCRIPTION OF THE PREFERRED EMBODIMENTS

Figure 1:
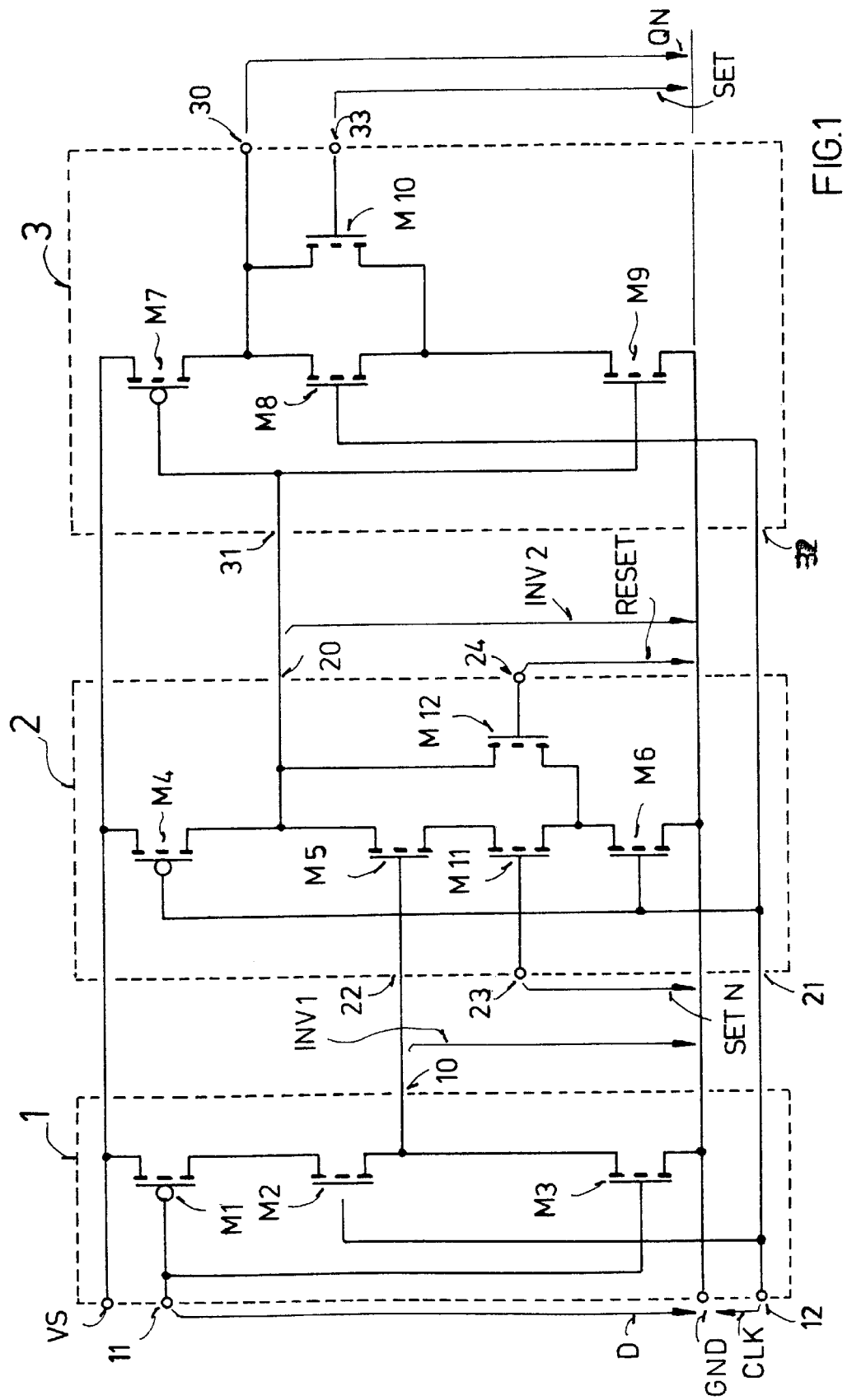
FIG. 1 is a circuit diagram of the bistable flip-flop in accordance with the invention.

The invention will now be described on the basis of an embodiment example with reference to the figures:

In accordance with FIG. 1, the flip-flop has a total of 12 field-effect transistors designated M1 . . . M12 of which the first, the second, the fourth and the seventh M1, M2, M4 and M7 respectively are PMOS transistors and the third, the fifth, the sixth, the eighth, the ninth, the tenth, the eleventh and the twelfth M3, M5, M6, M8, M9, M10, M11 and M12 respectively are NMOS transistors. The first, the second and the third field-effect transistors M1, M2, M3 form the first inverter stage 1, the fourth, the fifth, the sixth, the eleventh and the twelfth field-effect transistors M4, M5, M6, M11, M12 form the second inverter stage 2 and the seventh, the eighth, the ninth and the tenth field-effect transistors M7, M8, M9, M10 the third inverter stage 3.

In the first inverter stage 1, its output 10 is connected via the drain-source links (connected in series with each other) of the first and second field-effect transistors M1, M2 to a first power supply terminal VS, which is at a first supply potential, and via the drain-source link of the third field-effect transistor to a second power supply terminal GND, which is at a second supply potential (e.g. ground potential). In the second inverter stage 2, its output 20 is connected via the drain-source link of the fourth field-effect transistor M4 to the first power supply terminal VS, and via the drain-source links (connected in series with each other) of the fifth and eleventh field-effect transistors M5, M11 as well as via the drain-source link of the twelfth field-effect transistor M12 to the drain terminal of the sixth field-effect transistor M6 and via its drain-source link to the second power supply terminal GND. In the third inverter stage 3, its output 30 is connected via the drain-source link of the seventh field-effect transistor M7 to the first power supply terminal VS and via the drain-source link of the eighth field-effect transistor M8 as well as via the drain-source link of the tenth field-effect transistor M10 to the drain terminal of the ninth field-effect transistor M9 and via its drain-source link to the second power supply terminal GND.

Furthermore, in the inverter stages 1, 2, 3 the gate terminals of two field-effect transistors at a time, namely those of the first and third field-effect transistors M1, M3, and those of the fourth and sixth field-effect transistors M4, M6, and those of the seventh and ninth field-effect transistors M7, M9 are connected to the signal input 11 and 21 and 31 of the associated inverter stages 1, 2, 3 respectively. In addition, the gate terminal of the second field-effect transistor M2 represents a control input 12 on the first inverter stage 1, the gate terminal of the fifth field-effect transistor M5 represents a control input 22 on the second inverter stage 2, the gate terminal of the eighth field-effect transistor M8 represents a control input 32 on the third inverter stage 3, the gate terminals of the tenth and eleventh field-effect transistors M10, M11 represent two set inputs 33 and 23 of the flip-flop driven in phase opposition, and the gate terminal of the twelfth field-effect transistor M12 represents a reset input 24 of the flip-flop.

The output 10, to which the output voltage INV1 is applied as output signal of the first inverter stage 1, is connected to the control input 22, the output 20, to which the output voltage INV2 is applied as output signal of the second inverter stage 2, is connected to the signal input 31, and the control input 12, to which the clock signal CLK is supplied as control voltage, is connected to the signal input 21 and the control input 32. The signal input 11 represents the input of the flip-flop to which the input signal D is supplied as input voltage, and the output 30 represents the output of the flip-flop at which the output signal QN is made available as output voltage. Finally, the first set signal SET is supplied to the gate terminal of the tenth field-effect transistor M10, the second set signal SETN complementary to the first set signal SET is supplied to the gate terminal of the eleventh field-effect transistor M11, and the reset signal RESET is supplied to the gate terminal of the twelfth field-effect transistor M12.

At certain signal levels on the signal inputs 11, 21, 31 of the inverter stages 1, 2, 3, the control voltages supplied to their respective control inputs 12, 22, 32 can cause these to be switched to a disabling state in which the current paths between their outputs 10, 20, 30 respectively and the two supply terminals VS, GND are disabled. As a consequence, the charges from the gate capacitances of the field-effect transistors connected downstream of the respective outputs 10, 20, 30 cannot be cleared and hence the signal levels at these outputs 10, 20, 30 remain unchanged, i.e. they are buffered.

In the present example, the first inverter stage 1 is switched into the disabling state at a low level of the input signal D by a high level of the clock signal CLK, the second inverter stage 2 at a high level of the clock signal CLK by a low level of the output signal INV1 of the first inverter stage 1, and the third inverter stage 3 at a high level of the output signal INV2 of the second inverter stage 2 by a low level of the clock signal CLK. Disabling of the second and third inverter stages 2, 3 can be inhibited by a high level of the reset signal RESET or by a high level of the first set signal SET. Furthermore, the first inverter stage 1 is not disabled at a high level of the input signal D, nor the second inverter stage 2 at a low level of the clock signal CLK, nor the third inverter stage 3 at a low level of the output signal INV2 of the second inverter stage 2. Also, the second inverter stage 2 can be switched into the disabling state at a high level of the clock signal CLK additionally by a low level of the second set signal SETN.

FIG. 2 shows the pulse diagrams of the input signal D, the clock signal CLK, the set signals SET, SETN, the reset signal RESET and the output signals INV1, INV2, QN for the case where the tenth, eleventh and twelfth field-effect transistors M10, M11, M12 are disabled, i.e. for the case where the reset signal RESET and the first set signal SET each have a low level and the second set signal SETN has a high level. In this case, a change in level of the input signal D from low to high causes immediately thereafter a high-low change in level of the output signal INV1 and, provided the output signal INV2 does not already have a high level, at the next high-low signal edge of the clock signal CLK a low-high change in level of the output signal INV2 and also, at the next low-high signal edge of the clock signal CLK, a change in level of the output signal QN from high to low. However, a change in level of the input signal D from high to low at a low level of the clock signal CLK causes an immediate (or otherwise only at the next high-low signal edge of the clock signal CLK) change in level of the output signal INV1 from low to high and at the next low-high signal edge of the clock signal CLK a change in level of the output signals INV2 and QN from high to low and from low to high respectively.

As shown in FIG. 3, the output signal QN of the flip-flop is set to a low level by a high level of the first set signal SET and a low level of the second set signal SETN. This level of the set signals SET, SETN causes the tenth field-effect transistor M10 to switch into the conductive state and the eleventh field-effect transistor M11 into the disabling state and consequently the third inverter stage 3 can no longer be disabled and the second inverter stage is disabled at a high level of the clock signal CLK. At the next low level of the clock signal CLK, the output signal INV2 then assumes a high level and immediately thereafter it sets the signal level of the output signal QN to low.

Owing to the high level of the reset signal RESET, the drain-source links of the fifth and eleventh field-effect transistors M5, M11 are short-circuited through the twelfth field-effect transistor M12 so that the second inverter stage 2 cannot be disabled. Since the third inverter stage 3 is then conductive only at a high level of the clock signal CLK, i.e. at a low level of the output signal INV2, the output signal QN is reset to the high level by this measure.

In order to ensure reliable setting and resetting of the flip-flop (that is, the setting of the output voltage to low level and resetting to high level), the set signals SET and SETN and the reset signal RESET must be on at least for the duration of a period of the clock signal CLK.

By selecting suitable channel width-to-length ratios for the field-effect transistors M1 . . . M12, the flip-flop can be optimized in terms of achieving a high signal processing rate. In the present example, these ratios were selected for the first field-effect transistor as 40, for the second and sixth field-effect transistors M2, M6 as 24, for the third field-effect transistor M3 as 18, for the seventh field-effect transistor M7 as 50, for the ninth field-effect transistor M9 as 32, and for the remainder as 20.

What is claimed is:

1. Bistable flip-flop with a first inverter stage (1) driven by an input signal (D) and capable of being switched into a disabling state by a clock signal (CLK), with a second inverter stage (2) which is driven by the clock signal (CLK) and which can be switched into a disabling state by an output signal (INV1) of the first inverter stage (1), and with a third inverter stage (3) which is driven by an output signal (INV2) of the second inverter stage (2) and which can be switched into a disabling state by the clock signal (CLK), wherein the third inverter stage (3) can be switched into a non-disabling state by a first set signal (SET) and the second inverter stage (2) can be switched into the disabled state by a second set signal (SETN) at a specific signal level of the clock signal (CLK).

2. Bistable flip-flop in accordance with claim 1, wherein the third inverter stage (3) has in a current path between its output (30) and a first power supply terminal (VS) a field-effect transistor (M7) of a first channel type driven on the gate side by the output signal (INV2) of the second inverter stage (2) and in a current path between its output (30) and a second power supply terminal (GND) two field-effect transistors (M8, M9) of a second channel type with drain-source links connected in series and on the gate side driven respectively by the clock signal (CLK) and the output signal (INV2) of the second inverter stage (2) and also another field-effect transistor (M10) of the second channel type driven on the gate side by the first set signal (SET) with drain-source link connected in parallel to the drain-source link of the field-effect transistor (M8) driven by the clock signal (CLK).

3. Bistable flip-flop in accordance with claim 2, wherein the second inverter stage (2) has in a current path between its output (20) and the first power supply terminal (VS) a field-effect transistor (M4) of the first channel type driven on the gate side by the clock signal (CLK) and in a current path between its output (20) and the second power supply terminal (GND) three field-effect transistors (M5, M11, M6) of the second channel type with their drain-source links connected in series and on the gate side driven respectively by the clock signal (CLK), the second set signal (SETN) and the output signal (INV1) of the first inverter stage (1), and wherein the second set signal (SETN) is a signal that is complementary signal to the first set signal (SET).

4. Bistable flip-flop in accordance with claim 3, wherein the second inverter stage (2) can be switched by a reset signal (RESET) into a non-disabling state.

5. Bistable flip-flop in accordance with claim 4, wherein the second inverter stage (2) has an additional field-effect transistor (M12) of the second channel type driven on the gate side by the reset signal (RESET) with drain-source link connected in parallel to the drain-source link of the field-effect transistor (M5) driven by the output signal (INV1) of the first inverter stage (1).

6. Bistable flip-flop in accordance with claim 5, wherein the additional field-effect transistor (M12) of the second inverter stage (2) connected in terms of its drain-source link in parallel to the in-series connected drain-source links of the field-effect transistor (M5) driven by the output signal (INV1) of the first inverter stage (1) and of the field-effect transistor (M11) driven by the second set signal (SETN).

7. Bistable flip-flop in accordance with claim 6, wherein the first inverter stage (1) has in a current path between its output (10) and the first power supply terminal (VS) two field-effect transistors (M1, M2) of the first channel type with drain-source links connected in series and driven on the gate side respectively by the input signal (D) and the clock signal (CLK), and in a current path between its output (10) and the second power supply terminal (GND) a field-effect transistor (M3) of the second channel type driven on the gate side by the input signal (D).

8. Bistable flip-flop in accordance with claim 7, wherein the field-effect transistors (M1 . . . M12) are designed as MOS transistors.

9. Bistable flip-flop in accordance with claim 8, wherein the field-effect transistors (M1, M2, M4, M7) of the first channel type are designed as PMOS transistors and the field-effect transistors (M3, M5, M6, M8, M9, M10, M11, M12) of the second channel type are designed as NMOS transistors.

* * * * *